United States Patent
Wanzakhade et al.

(10) Patent No.: US 6,845,024 B1
(45) Date of Patent: Jan. 18, 2005

(54) RESULT COMPARE CIRCUIT AND METHOD FOR CONTENT ADDRESSABLE MEMORY (CAM) DEVICE

(75) Inventors: Sanjay M. Wanzakhade, San Jose, CA (US); Michael C. Stephens, Jr., San Jose, CA (US); Jagadeesan Rajamanickam, San Jose, CA (US); David V. James, Palo Alto, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/317,918

(22) Filed: Dec. 12, 2002

Related U.S. Application Data

(60) Provisional application No. 60/343,973, filed on Dec. 27, 2001.

(51) Int. Cl.[7] ............................................. G11C 15/00
(52) U.S. Cl. ................ 365/49; 365/189.07; 365/189.02
(58) Field of Search ............................. 365/49, 189.07, 365/189.02

(56) References Cited

U.S. PATENT DOCUMENTS

| | | | | |
|---|---|---|---|---|
| 5,010,516 A | * | 4/1991 | Oates | 365/49 |
| 5,845,314 A | | 12/1998 | Ishida | |
| 6,650,561 B2 | * | 11/2003 | Batson et al. | 365/49 |
| 2004/0042241 A1 | * | 3/2004 | McKenzie et al. | 365/49 |

* cited by examiner

*Primary Examiner*—Huan Hoang
(74) *Attorney, Agent, or Firm*—Bradley T. Sako

(57) ABSTRACT

A content addressable memory (CAM) device (100) may include a number of blocks (102-[n−1, n, n+1]) that each generate CAM search results and result compare circuits (104-[n−1, n, n+1] that receive CAM search results from multiple blocks (102-[n−1, n, n−1]), and compare at least a portion of such CAM search results. According to such a comparison result, a compare circuit (104-[n−1, n, n+1]) can generate an output CAM search result for subsequent comparison with CAM search result in another compare circuit (104-[n−1, n, n+1]).

23 Claims, 5 Drawing Sheets

RESULT COMPARE CIRCUIT AND METHOD FOR CONTENT ADDRESSABLE MEMORY (CAM) DEVICE

This application claims the benefit of provisional application Ser. No. 60/343,973 filed Dec. 27, 2001.

TECHNICAL FIELD

The present invention relates generally to semiconductor integrated circuit devices, and more particularly to a content addressable memory (CAM) device that generates an overall function result from multiple internal function results.

BACKGROUND OF THE INVENTION

Due to the increasing need for rapid matching capabilities, in networking hardware equipment for example, content addressable memories (CAMs) continue to proliferate. A CAM may perform matching functions by applying a search key or "comparand" to a table of stored data values. A CAM may then determine if any of the data values match a given search key.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic RAM (DRAM) type cells. Alternate approaches may include RAM arrays, or the like, with separate matching circuits and/or matching processes executed by a processor, or the like.

Conventional CAM devices may include both binary and ternary CAM devices. Binary CAM devices can provide a bit-by-bit comparison between a stored data value and a search key. Ternary CAM devices can provide maskable compare operations that can selectively exclude predetermined bits of a data value from a compare operation.

Typically, a conventional CAM device can generate match indications for each entry. That is, each entry can be compared with an applied search key value. If a search key value matches a stored data value, a match (or "hit") indication may be generated for the entry. Conversely, if a search key value does not match a stored data value, a mismatch (or "miss") indication may be generated for the entry.

Match results in a CAM device may include single match results, that can be generated when a single entry matches an applied key value, as well as multiple match results, that may be generated when more than one entry matches an applied key value. Typically, a search result may include an index value, which can serve as an indirect pointer to associated data, or search result data itself (associated data). Thus, a search result may be conceptualized as including not only a result (an index or associated), but also a status (match, multiple match, no match, etc.).

Referring now to FIG. 11, a conventional CAM device is set forth in a block diagram and designated by the general reference character 1100. A conventional CAM device 1100 may include a number of entries (ENTRY0 to ENTRYn) 1102 and a priority encoder 1104. Each entry (ENTRY0 to ENTRYn) may store a data value for comparison with an applied key value KEY. In a conventional compare operation, a key value KEY can be applied to entries (ENTRY0 to ENTRYn) essentially simultaneously. That is, a key value KEY can be applied to all entries (ENTRY0 to ENTRYn).

Each entry (ENTRY0 to ENTRYn) can generate a corresponding match indication (MATCH0 to MATCHn) that can reflect whether or not data for an entry matches an applied key value. More particularly, if entry data matches a key value, a corresponding match indication can be active. If entry data does not match a key value, a corresponding match indication can be inactive.

Priority from among multiple active match indications can be established by a priority encoder 1104. More particularly, a conventional priority encoder 1104 can prioritize match indications according to a "physical" priority of the entries. A physical priority can be a priority established by a physical location of an entry on a conventional CAM device. Typically, physical priority can correspond to an address of an entry, with a lower address value having priority over a higher address value.

In the example of FIG. 11, a priority encoder 1104 can encode a highest priority match indication into an index value INDEX. In some conventional approaches, an index value can be used to access associated data, or alternatively, a highest priority match indication can access associated data directly.

In the particular example of FIG. 11, a conventional priority encoder 1104 may also include a multiple match detect circuit that can generate status data. Status data can include a single match indication MATCH, multiple match indication MMATCH, and no match indication MISS.

In many applications, it is desirable to generate match results for as many entries as possible, as fast as possible. However, as CAM arrays are scaled upward, lines (e.g., match lines, bit lines, word lines, etc.) can get longer, requiring more power to drive to particular logic level. Further, such lines may present greater capacitive loads to driver circuits, which can slow operations.

One way to scale up compare results can be to employ multiple CAM devices. A conventional search engine system that can include multiple conventional CAM devices, such as that shown in FIG. 11, is shown in FIG. 12 and designated by the general reference character 1200. In the example of FIG. 12, a search engine system 1200 includes "n+1" CAM devices, shown as 1202-0 to 1202-n. A search engine system 1200 may perform search operations in response to commands from a requesting device. In FIG. 12, a requesting device is a network processing unit (NPU) 1204.

FIG. 12 shows an example of a bus based search engine system. In a bus based search engine system, CAM devices may be commonly connected to a requesting device and to one another by a common bus. Thus, in FIG. 12 CAM devices (1202-0 to 1202-n) can be commonly connected to each other and to an NPU 1204 by a bus 1206.

In conventional bus based search engine systems, each CAM device may simultaneously compare a key with entries of its respective CAM array. If a CAM device has a match, the CAM device may forward a match indication (e.g., a flag or the like) to a next, lower priority CAM device. A higher priority CAM device may output a result and a lower priority CAM device can be disabled from outputting data to the common output bus. If, however, a higher priority CAM device does not have a match, such a device may not assert a match indication, and a lower priority CAM device can provide an output result.

A drawback to an approach like that of FIG. 12 can be the lack of flexibility in entry arrangement, as well as the additional complexity of connection. Flexibility can be limited as priority is based on a CAM device position in the system. Connection complexity can be greater as connections can be needed that disable lower priority CAM devices in the event of a match in a higher priority CAM device.

In light of the above, it would be desirable to arrive at some way of generating compare results for a large number of CAM entries, without the drawbacks of conventional approaches.

SUMMARY OF INVENTION

According to the present invention, a result compare circuit may include a comparator circuit having a first input coupled to receive a first result status value from a first portion of a content addressable memory (CAM) and a second input coupled to receive a second result status value from a second portion of the CAM.

According to one aspect of the embodiments, a comparator circuit can include a number of bit comparators. Such bit comparators can have a significance with respect to one another. Each bit comparator may also generate a bit comparison result.

According to another aspect of the embodiments, a comparator can provide bit compare results to a subsequent result compare circuit in a result compare flow. In addition, a compare circuit may receive bit compare results from a prior result compare circuit in the result compare flow.

According to another aspect of the embodiments, a bit comparison from a bit comparator can include a greater-than result, a less-than result, and an equal-to result.

According to another aspect of the embodiments, a bit comparator can include a first portion that receives a bit from the first result status value, a bit from the second result status value, and compare results from a higher significance bit comparator. The bit comparator may output a bit comparison result to a bit comparator of less significance.

According to another aspect of the embodiments, a bit comparator can include a second portion that receives a bit from the first result status value, a bit from the second result status value, and compare results from a higher significance bit comparator. A bit comparator may also output a first result status bit if the higher significance compare indication is greater-than, output a second result status bit if the higher significance compare indication is less-than, and output a highest of the first or second result status bit if the higher significance compare result is equal-to.

According to another aspect of the embodiments, a comparator circuit may further include a summary result generator that can output one value if a selected portion of a first status result value matches a corresponding portion of a second status result value.

According to another aspect of the embodiments, a result compare circuit may also include a multiplexer (MUX) having a first MUX input that receives result data from the first portion of the CAM, a second MUX input that receives result data from the second portion of the CAM, and a control input coupled to the comparator circuit. A first MUX can have an output coupled to an input of another result comparator circuit.

The present invention may also include a method of generating search results in a content addressable memory (CAM) device. The method may include generating search results in a number of CAM sections that each include a plurality of CAM entries, where each search result can include a priority value. The method may also include comparing multiple priority values to generate a highest priority search result from a number of search results.

According to one aspect of the embodiments, a step of comparing multiple priority values can include comparing a first priority value for a first search result with a second priority value from a second search result to generate a compare result. At least a portion of either the first search result or second search result can be output according to the compare result.

According to another aspect of the embodiments, a method may also include forwarding at least a portion of a compare result between a first priority value and a second priority value for comparison with a third priority value from a third search result. Such a portion of a compare result may be forwarded before selectively outputting at least a portion of either the first search result or second search result.

According to another aspect of the embodiments, comparing a first priority value to a second priority value can include comparing bits of a first priority value to corresponding bits of a second priority value. Such a comparing of values can be sequential, from a more significant bit to a less significant bit. In addition or alternatively, such a comparing of bits may be executed in parallel.

According to another aspect of the embodiments, comparing a bit of the first priority value to a corresponding bit of the second priority value can include generating a bit compare result if a more significant bit compare result is an equal-to result, generating a greater-than result if a more significant bit compare result is a greater-than result, and generating a less-than result if a more significant bit compare result is a less-than result.

According to another aspect of the embodiments, comparing a bit of a first priority value to a corresponding bit of a second priority value can include outputting a bit of the first priority value if a more significant bit compare result is a greater-than result, outputting the higher of a bit of the first priority value and a bit of a second priority value if a more significant bit compare result is an equal-to result, and outputting a bit of the second priority value if a more significant bit compare result is a less-than result.

The present invention may also include a content addressable memory (CAM) device having a number of sub-blocks that each compare a key value to stored data values. Such a CAM device may also include at least one sub-block magnitude comparator for selectively providing an output of one of a plurality of sub-blocks according to a priority value associated with the one sub-block.

According to one aspect of the embodiments, a CAM device may also include a number of sub-blocks arranged into blocks, and a block magnitude comparator for selectively providing an output of one of the blocks according to a priority value associated with at least one of the sub-blocks in the one block.

According to another aspect of the embodiments; a CAM device may also include a multiplexer having a first input coupled to one of a plurality of sub-blocks, a second input coupled to another one of the plurality of sub-blocks, and a control input coupled to at least one sub-block magnitude comparator.

According to another aspect of the embodiments, a CAM device a sub-block magnitude comparator can have a first input coupled to receive at least a first data value from one of the plurality of sub-blocks, a second input coupled to another one of the plurality of sub-blocks, and an output that provides a magnitude compare result for values received at the first and second inputs.

According to another aspect of the embodiments, the at least one sub-block magnitude comparator can include a first sub-block magnitude comparator having a plurality of bit comparators having a significance with respect to one another that each generate bit compare results, and a second sub-block comparator having a plurality of bit comparators having a significance with respect to one another, each bit comparator being coupled to receive a bit compare result from a bit comparator of the first sub-block comparator.

According to another aspect of the embodiments, a priority value can include a status value corresponding to a type of match result and a soft-priority value that can be a programmable value assigned to a sub-block.

DETAILED DESCRIPTION OF THE EMBODIMENTS

Various embodiments of the present invention will now be described in conjunction with a number of figures. The embodiments describe a result compare circuit arrangement that may be included in a CAM device. Result compare circuits may select from between multiple results generated by different portions of a CAM device, to thereby arrive at a highest precedent result according to predetermined criteria.

A result compare circuit may be used in search engine devices that can "vote" between multiple input search responses to generate an output search response. Such a search engine device and operation is shown in commonly owned co-pending U.S. Patent Application, having Ser. No. 10/199,225, filed on Jul. 19, 2002, and titled SEARCH ENGINE DEVICE AND METHOD FOR GENERATING OUTPUT SEARCH RESPONSES FROM MULTIPLE INPUT SEARCH RESPONSES, by James et al. The contents of this patent application are incorporated by reference herein.

Figure 1:
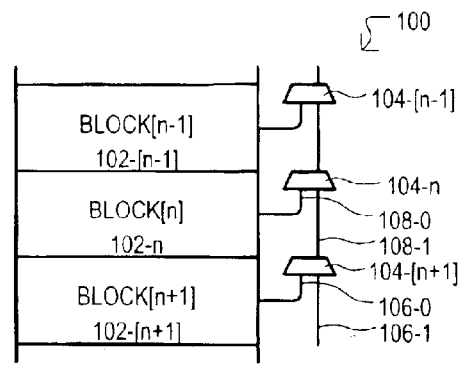
FIG. 1 is a block schematic diagram of a content addressable memory (CAM) device according to one embodiment of the present invention.

Referring now to FIG. 1, a content addressable memory (CAM) device according to one embodiment is set forth in a block schematic diagram and designated by the general reference character 100. A CAM device 100 can include a number of blocks, three of which are shown as 102-[$n$−1], 102-$n$, and 102-[$n$+1]. Each block (102-[$n$−1, $n$, $n$+1]) can generate an output value. Such output values may preferably include CAM search results, such as miss, match, multiple match, etc.

Preferably, each block (102-[$n$−1, $n$, $n$+1]) may include a collection of CAM entries, and corresponding circuits for generating search results, or the like. Accordingly, each block (102-[$n$−1, $n$, $n$+1]) can be conceptualized as providing results for a particular portion of a CAM device. Such an arrangement may allow for a CAM device to be segmented into blocks that may each generate results.

A CAM 100 may further include one or more result compare circuits, three of which are shown as 104-[$n$−1], 104-$n$, and 104-[$n$+1]. A compare circuit (104-[$n$−1, $n$, $n$+1]) can receive CAM search results from multiple blocks (102-[$n$−1, $n$, $n$+1]), and compare at least a portion of such CAM search results. More particularly, in the particular arrangement of FIG. 1, a compare circuit (104-[$n$−1, $n$, $n$+1]) may receive CAM search results from two blocks (102-[$n$−1, $n$, $n$+1]), or one CAM search result from a block (102-[$n$−1, $n$, $n$+1]) and another CAM search result from a compare circuit (104-[$n$−1, $n$, $n$+1]) that represents a CAM search result for all previous blocks (102-[$n$−1, $n$, $n$+1]) in a compare flow. In FIG. 1, a compare flow can be conceptualized as proceeding from compare circuit 104-[$n$+1] to compare circuit 104-$n$, to compare circuit 104-[$n$−1].

According to such a comparison result, a compare circuit (104-[$n$−1, $n$, $n$+1]) can generate an output CAM search result for subsequent comparison with CAM search result in another compare circuit (104-[$n$−1, $n$, $n$+1]).

For example, referring to FIG. 1, a compare circuit 104-[$n$+1] may receive CAM search results from some other block or compare circuit (not shown) via one input 106-1 and CAM search results from block 102-[$n$+1] via another input 106-0. From the two received CAM search results, compare circuit 104-[$n$+1] may generate an output CAM search result, and forward such a CAM search result to another compare circuit 104-$n$ in a compare flow. Compare circuit 104-$n$ may receive a CAM search result from compare circuit 104-[$n$+1] via input 108-1 and a CAM search result from block 102-$n$ via input 108-0, and generate an output CAM search result. Such an output CAM search result may be forwarded to a next compare circuit 104-[$n$−1] in a compare flow.

In this way, an overall CAM search result from multiple CAM search results can be generated by one or more compare circuits 104-[$n$−1, $n$, $n$+1]. That is, the above arrangement of compare circuits can determine a search result precedence from among multiple search results.

It is noted that while compare circuits 104-[$n$−1, $n$, $n$+1] may compare at least a portion of received CAM result values, such circuits may also generate additional data, such as a "summary" indication. A summary indication can indicate when two like CAM search result values are received. Thus, if a compare circuit 104-[$n$−1, $n$, $n$+1] receives two CAM search results of "single match," such a compare circuit may output a "multiple match" summary result. In a similar fashion, blocks 102-[$n$−1, $n$, $n$+1] may output CAM search results of miss, with additional data indicating particular amount of free entries (e.g., miss free entry, miss free sub-block, miss free block). In response to same type CAM search results, a compare circuit 104-[$n$−1, $n$, $n$+1] may generate a summary result (e.g., miss-free entries, miss-free sub-blocks, miss-free blocks).

A summary result may be indicated by one or more bits in CAM search result.

It is also noted that CAM search results can be considered to have a priority with respect to one another. Thus, a compare circuit 104-[n–1, n, n+1] may generate an output CAM search result based on priorities of input CAM search results.

Still further, a compare circuit 104-[n–1, n, n+1] may generate output CAM search results based on a predetermined compare operation. As but one very particular example, a compare circuit 104-[n–1, n, n+1] may output all, or a portion of a CAM search result based on a magnitude comparison of priority data within received CAM search results. In a very particular arrangement, a magnitude comparison operation may generate comparison results of greater-than, and/or less-than, and/or equal-to.

In this way, blocks 102-[n–1, n, n+1] may generate a number of CAM search results, and according to comparison between of such CAM search results, a highest priority CAM search result may be generated. That is, a precedence among search results can be established.

Still further, while the description of FIG. 1 describes a CAM device 100 arranged into blocks, a CAM device may include a hierarchical arrangement of multiple groups of CAM entries. Thus, the term "block" is not intended to represent any particular level in such a hierarchical structure. Further, while, FIG. 1 shows a single compare flow, multiple such flows may be arranged in parallel and merged with one another.

Examples of a hierarchical CAM device arrangement with multiple compare flows will be described at a later point herein with reference to FIG. 3.

Figure 2:
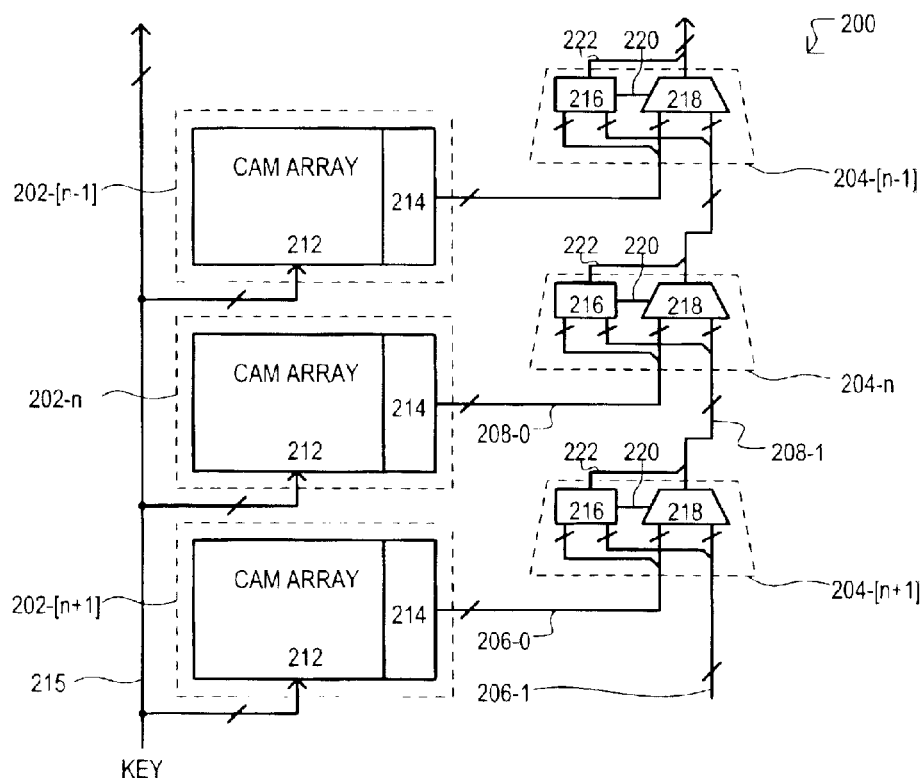
FIG. 2 is a block schematic diagram of a CAM device according to another embodiment of the present invention.

FIG. 2 is a block schematic diagram showing one very particular arrangement of a CAM device. The CAM device is designated by the general reference character 200, and may include some of the same general constituents as FIG. 1. Thus, like constituents are referred to by the same reference character but with a first digit being a "2" instead of a "1".

In the example of FIG. 2, each block 204-[n–1, n, n+1] may include a CAM array 212 and a CAM result circuit 214. A CAM array may include a number of CAM entries and may receive input values by way of at least one input bus 215. In a search-type operation, a CAM device 200 may receive search key value KEY, which may be compared to data values stored entries of CAM arrays 212.

A CAM result circuit 214 may include circuits that generate a CAM result value in response to match indications from entries within a corresponding CAM array 212. As but one example, a CAM result circuit 214 may include a priority encoder, that can prioritize match results and encode a highest priority match result into an index value, a multiple match detect circuit that may indicate when multiple match indications are generated, and an encoding circuit that may encode a result status value into a multi-bit status code. Such a result status value can be conceptualized as a search result factor. Such various search result factors may thus establish a precedence from among multiple search results.

As also shown in FIG. 2, a compare circuit 204-[n–1, n, n+1] may include a comparator 216 and a corresponding multiplexer (MUX) 218. A comparator 216 may receive at least a portion of two CAM search results. According to a comparison between such received CAM search results, a comparator 216 may output a select signal on at least one select line 220 to a corresponding MUX 218.

In one particular arrangement, in addition to a select signal, a comparator 216 may also provide a summary result value on a summary result line 222. Such a summary result value can be merged with a CAM result output from a corresponding MUX 218.

A MUX 218 may output one of two received CAM search results according to a select signal from a corresponding comparator 216.

Figure 3:
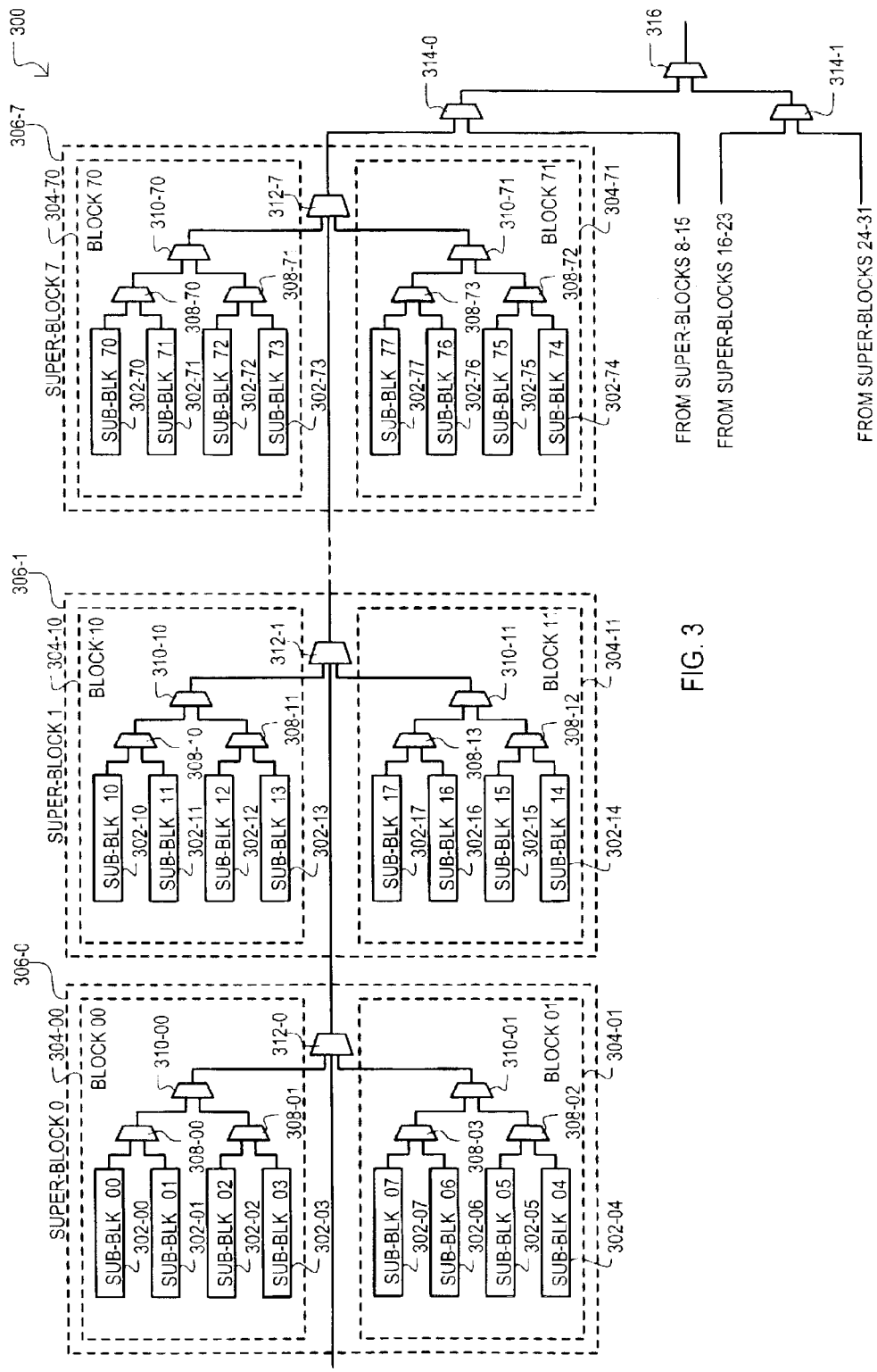
FIG. 3 is a block schematic diagram of a CAM device according to another embodiment of the present invention.

FIG. 3 is a block schematic diagram of a CAM device according to another embodiment that is designated by the general reference character 300. A CAM device 300 may have CAM entries arranged into a hierarchical structure, including a sub-blocks, which can form blocks. Blocks, in turn, can be organized into "super-blocks." In the very particular example of FIG. 3, each super-block can include two blocks, and each block can include four sub-blocks. Sub-blocks are shown in FIG. 3 as 302-xy, where x can indicate a super-block to which a sub-block belongs, and y can range from 0–7. Blocks are shown in FIG. 3 as 304-xz, where x can indicate a super-block to which a block belongs, and z can range from 0–1. Super-blocks are shown as 306-0 to 306-7.

In FIG. 3, within each block (304-00 to 304-71), CAM search results from two sub-blocks of a same block may be received by first level compare circuits 308-00 to 308-73. In response to such input CAM search results, each first level compare circuits (308-00 to 308-73) may generate an output CAM search result, that may include all or a portion of, one of the input CAM search results.

Still further, within each block (304-00 to 304-71) CAM search results output from first level compare circuits (308-00 to 308-73) may be received by a second level compare circuit 310-00 to 318-71. In response to such input CAM search results, each of the second level compare circuits (310-00 to 310-71) may generate an output CAM block search result, that may include all or a portion of one of the input CAM search results.

Because first level compare circuits (308-00 to 308-73) and second level compare circuits (310-00 to 310-71) generate a CAM search result from among sub-block search results, such compare circuits may be conceptualized as sub-block compare circuits.

Referring still to FIG. 3, within each super-block (306-0 to 306-7), CAM block search results from two blocks of a same super-block may be received by third level compare circuits 312-0 to 312-7. Each third level compare circuit (312-0 to 312-7) may also receive a CAM super-block search result. In response to two CAM block search results and a super-block search result, each third level compare circuit (312-0 to 312-7) may generate an output super-block CAM search result.

Because third level compare circuits (312-0 to 312-7) generate a CAM search result from among block CAM search results, such compare circuits may be conceptualized as block compare circuits.

Operations of third level compare circuits (312-0 to 312-7) may have a hierarchy, with a last third level compare circuit 312-7 of a given group of super-blocks (306-0 to 306-7) providing a group super-block CAM search result.

Even higher hierarchical results are shown in FIG. 3 by fourth level compare circuits 314-0 and 314-1 that may each receive group super-block CAM search results. For example, fourth level compare circuit 314-0 may receive a super-block CAM search result for super-blocks 306-0 to 306-7, and a super-block CAM search result for another set of super-blocks (SUPER-BLOCKS 8–15), not shown in FIG. 3. In response to two CAM super-block set search results, each fourth level compare circuit (314-0 and 314-1) may generate a CAM super-set search result. CAM super-set search results may be received by fifth level compare circuit 316, which may generate a highest level CAM search result for the shown super-blocks. Thus, in the particular arrangement of FIG. 3, fifth level compare circuit 316 may generate a highest level CAM search result from among the CAM entries of 32 super-blocks.

In one very particular approach, first level compare circuits (308-00 to 308-73), second level compare circuits (310-00 to 310-71), fourth level compare circuits (314-0 and 314-1), and fifth level compare circuit 316 may have the same structure. In particular embodiments, such compare circuits may be two input compare circuits like those shown in FIG. 2.

Figure 4:
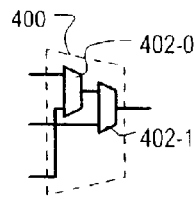
FIG. 4 is a block schematic diagram of a three input compare, circuit according to one embodiment.

Third level compare circuits (312-0 to 312-7) may have a structure like that shown in FIG. 4. FIG. 4 shows a three input compare circuit designated by the general reference character 400. A three input compare circuit 400 may include two, two input compare circuits 402-0 and 402-1. A two input compare circuit (402-0 and 402-1) may be a two input compare circuit like those shown in FIG. 2.

In one particular arrangement, a two input compare circuit 402-0 may have inputs that receive CAM block search results. A two input compare circuit 402-1 may have one output that receives an output from two input compare circuit 402-0, and another input that receives a CAM super-block search result.

Of course, alternate search arrangements according to the present invention may differ in flow but yield a same essential search result. For example, in one arrangement, a prior super-block search result may be compared to different super-block search results at a lower hierarchical level. For example, referring to FIG. 3, a super-block search result from a super-block 306-0 may be compared to sub-block search results in first level compare circuits (308-00 to 308-73) or second level compare circuits (310-00 to 310-71).

Figure 5:
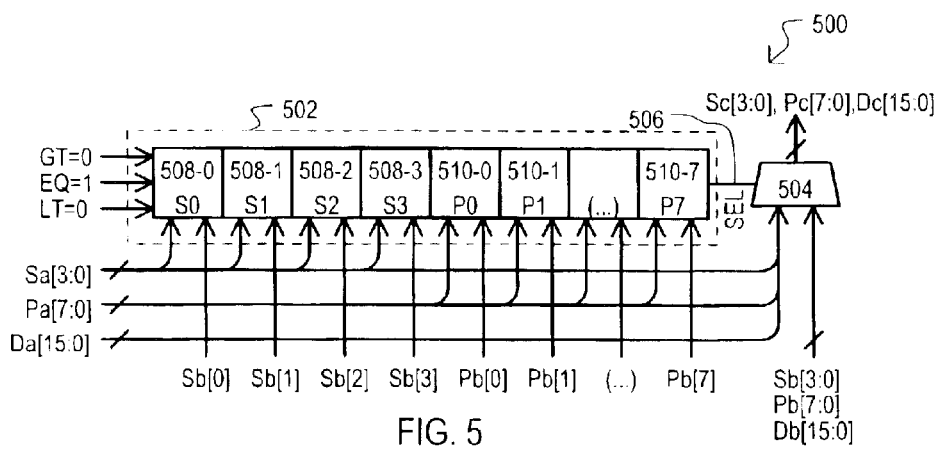
FIG. 5 is a block schematic diagram of a priority comparator circuit according to an embodiment of the present invention.

Having described various arrangements in which a compare circuit may include a comparator, one example of a comparator circuit is shown in FIG. 5 and designated by the general reference character 500. A comparator circuit 500 may receive two sets of CAM search result data, and generate output CAM search result data in response.

It is noted that while FIG. 5 shows a compare result that may incur in a sequential fashion from a more significant bit to a less significant bit, alternate embodiments can include compare circuits that compare all or a portion of search result data values in parallel.

In FIG. 5, first CAM search result data may include a status value Sa, a soft priority value Pa, and a data value Da. Second CAM search result data may include a status value Sb, a soft priority value Pb, and a data value Db. Status values (Sa and Sb) may be four bit values, soft priority values (Pa and Pb) may be eight bit values, and a data values (Da and Db) may be sixteen bit values.

In one particular approach, a status value (Sa or Sb) may reflect a status of a search result. Thus, different bit combinations of a status value (Sa or Sb) can indicate a CAM search result status, including but not limited to single match, multiple match, no match-free entry, no match-free entries, no match-free sub-block, no match-free sub-blocks, no match-free block, no match-free blocks, and values that may indicate another state. Such values can include "error" or "taken", as but two very particular examples.

Very specific examples of possible search result status values are disclosed in U.S. patent application Ser. No. 10/199,225, by James et al., cited above.

A soft priority value may be programmable values that can be set for each sub-block. As but one example, a soft-priority value may be set by a user of a CAM device by writing to a predetermined register address reserved to a sub-block soft-priority value.

A data value may be an index value. For example, a data value may be an index value generated by a priority encoder of a highest matching CAM entry, or in the event of a no match case, some predetermined value.

A comparator circuit 500 may include a bit comparator section 502 and a data MUX 504. A bit comparator section 502 may execute a bit-wise comparison between first status and soft priority values (Sa and Pa) and second status and priority values (Sb and Pb). In response to such a bit-wise comparison, a bit comparator section 502 may generate a select signal SEL on a select line 506.

Thus, in the very particular case of FIG. 5, priority among CAM search results can be established by a status value (Sa or Sb) in combination with a soft priority value (Pa or Pb).

According to a select signal SEL, a data MUX 504 may output a first CAM search result data [Sa, Pa and Da] or a second data value [Sb, Pb and Db] according to a select signal SEL.

A bit comparator section 502 may include a number of bit comparator circuits. In FIG. 5, bit comparator circuits 508-0 to 508-3 may compare corresponding bits of first and second status values (Sa and Sb), and bit comparator circuits 510-0 to 510-7 may compare corresponding bits of first and second soft-priority values (Pa and Pb).

For example, bit comparator circuit 508-0 may compare a first bit of first status value Sa[0] with a first bit of second status value Sb[0]. Similarly, bit comparator circuit 510-1 may compare a second bit of a first soft-priority value Pa[1] with a second bit of second soft-priority value Pb[1].

It is understood that in FIG. 5, bit comparator circuits for comparing first soft-priority values Pa[2:7] to second soft-priority values Pb[2:7] are excluded to avoid unduly cluttering the view.

Bit comparator circuits within a bit comparator section 502 may have a significance with one another. Thus, bit comparison results of one bit comparator circuit may be provided as an input to a less significant bit comparator circuit. In the particular arrangement of FIG. 5, bit comparators have a significance of most to least significance, going from left to right. Thus, in FIG. 5 bit comparator circuit 508-0 has a highest significance, while bit comparator 510-7 has a lowest significance.

Further, in the example shown in FIG. 5, each bit comparator circuit (508-0 to 508-3 and 510-0 to 510-7) can receive bit compare results and generate bit compare results. In FIG. 5 it is assumed that each bit comparator circuit may have a similar structure, and hence generate and receive the same types of compare results. Accordingly, bit comparator circuit 508-0, because it has a highest significance, can receive "preset" compare results. The particular preset compare results are shown as a greater-than result GT, equal-to-result EQ, and a less-than result LT. A bit comparator circuit 508-0 may provide its own comparison results to next significant bit comparator circuit 508-1. It is understood that once a bit comparator circuit generates a greater-than indication, all bit comparator circuits of less significance can be forced to generate a greater-than indication.

In this way, in a compare operation, bit comparison operations can "ripple" through bit comparator circuits in order of significance to arrive at a final compare result. Such a final compare result can generate a select signal SEL.

Of course, while the above description has described a "greater" magnitude comparison operation to establish priority, alternate approaches may include lower magnitude or other types of comparisons (e.g., range and/or particular match) to establish priority among multiple CAM search results within a same CAM device.

Figure 6:
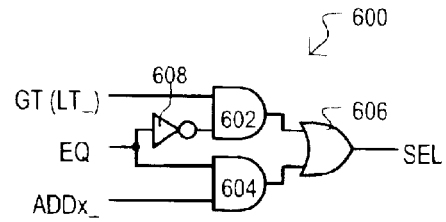
FIG. 6 is a schematic diagram of a select signal generator according to one embodiment of the present invention.

One example of how compare results can generate a select signal is shown in FIG. 6 FIG. 6 is a schematic diagram of a select signal generator 600. The particular select signal generator 600 of FIG. 6 may activate a select signal SEL (e.g., force it to a logic high) in response to a greater-than indication GT and deactivate a select signal SEL (e.g., force it to a logic low) in response to a less-than indication LT. In the event of an equal-to indication EQ, a select signal SEL may be activated/deactivated according to a secondary criteria. Such secondary criteria in FIG. 6 can be an inverse address value ADDx__. Thus in the event of a priority "tie", a "winning" CAM search result can be selected according to a physical priority reflected by such an address value. As but one example, an inverse address value ADDx__ can be an address bit that distinguishes addresses between one sub-block, a previous sub-block in a comparison flow.

The very particular example of FIG. 6 includes a first gate 602, a second gate 604, and third gate 606. A first gate 602 may be an AND-type gate that receives a greater-than indication GT (or inverse less-than indication LT__) at one input, and an inverted equal-to signal at another input, by way of inverter 608. Thus, if an equal-to indication EQ is low, a first gate 602 may output a greater-than indication GT (or inverse less-than indication LT__).

A second gate 604 may be an AND-type gate that receives an equal-to indication EQ at one input, and an inverse address value ADDx__ at another input. Thus, if an equal-to indication EQ is high, a second gate 604 may output an inverse address value ADDx__.

A third gate 606 may be an OR-type gate that may receive the outputs of first and second gates (602 and 604), and output a select signal SEL.

A select signal generator 600 could be included as a portion of a least significant bit comparator circuit (510-7 in the particular example of FIG. 5).

While an arrangement like that shown in FIG. 2, may provide for the generation of a highest priority CAM search result from among multiple CAM search results, it is noted that if a compare circuit (e.g., 216) executes a rippling bit comparison operation, like that described with reference to FIG. 5, data may not propagate to a next compare circuit until such a rippling comparison is complete.

Figure 7:
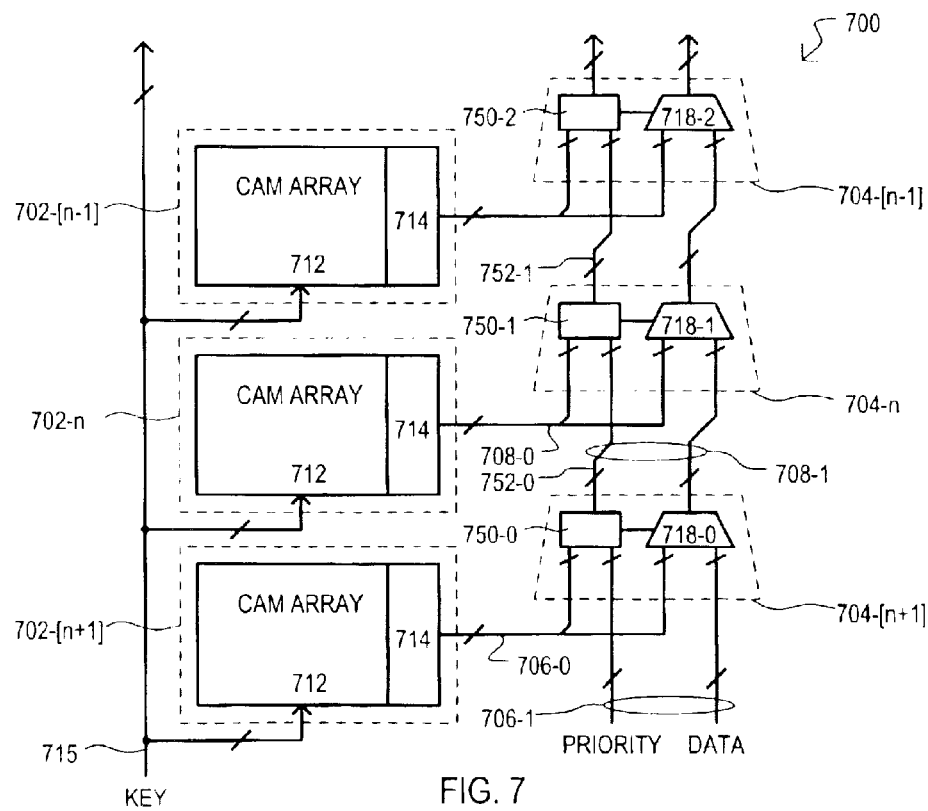
FIG. 7 is block schematic diagram of a CAM device according to another embodiment of the present invention.

An alternate embodiment that may provide an improved response over that of FIG. 2 is shown in FIG. 7.

FIG. 7 is a block schematic diagram showing one very particular arrangement of a CAM device. The CAM device is designated by the general reference character 700, and may include some of the same general constituents as FIG. 2. Accordingly, like constituents are referred to by the same reference character but with a first digit being a "7" instead of a "2".

Unlike the example of FIG. 2, a CAM device 700 according to FIG. 7 may include compare circuits 704-[n−1, n, n+1] with comparators (750-0 to 750-2) that can forward comparison results to a next comparator (750-0 to 750-2) in a compare flow. For example, comparison results from a comparator 750-0 can be forwarded to a next comparator 750-1 on an output bus 752-0. In the same general fashion, comparison results from a comparator 750-1 can be forwarded to a next comparator 750-2 on an output bus 752-1.

Accordingly, in the event comparison results from comparators (750-0 to 750-2) are multi-bit "rippling" values, compare operations in an upstream comparator may start prior to the conclusion of a downstream comparator. For example, comparator 750-0 could provide a most significant bit comparison result to comparator 750-1 before it generates a least significant bit comparison result and outputs one of two CAM search results via MUX 718-0.

Figure 8:
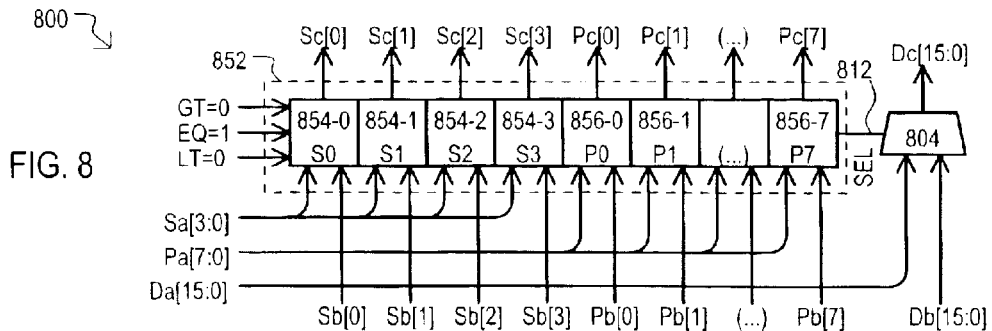
FIG. 8 is a block schematic diagram of a priority comparator circuit according to an embodiment of the present invention.

One example of a comparator circuit that can forward compare results is shown in FIG. 8 and designated by the general reference character 800. Like comparator circuit 500 of FIG. 5, a comparator circuit 800 may receive two sets of CAM search result data (Sa/Pa/Da and Sb/Pb/Db), and generate output CAM search result data in response.

A comparator circuit 800 may also include a bit comparator section 852 and a data MUX 804. However, unlike the arrangement of FIG. 5, a bit comparator section 852 may include bit comparator circuits 854-0 to 854-3 and 856-0 to 856-7 that forward bit compare results. For example, bit comparator circuit 854-0 may compare a first bit of first status value Sa[0] with a first bit of second status value Sb[0]. According to such a comparison, bit comparator circuit 854-0 may forward a bit compare result bit Sc[0]. Similarly, bit comparator circuit 856-1 may compare a second bit of a first soft priority value Pa[1] with a second bit of second soft priority value Pb[1], and forward a bit compare result bit Pc[1].

In a similar fashion to the approach shown in FIG. 5, bit comparisons can ripple from a most significant bit comparator circuit 854-0 to a least significant bit comparator circuit 856-7. Thus, if it is assumed that each bit comparator circuit may have a similar structure, a bit comparator circuit 854-0 of a highest significance, can receive "preset" compare results. Like FIG. 5, FIG. 8 shows a case in which bit compare results can include greater-than result GT, equal-to-result EQ, and a less-than result LT.

Thus, in FIG. 8, each bit comparator circuit (854-0 to 854-3 and 856-0 to 856-7) can be conceptualized as passing information in two directions. A first direction may be "horizontally" from more significant bits to less significant bits, while a second direction may be considered "vertically" from one bit comparator section to a similar bit comparator section that is "downstream" in a compare flow.

Accordingly, in particular arrangements, bit comparator circuits (854-0 to 854-3 and 850-0 to 856-7) may be conceptualized as including at least two passgates for each bit position. One passgate may pass information from a bit comparator circuit to less significant bit comparator (horizontal propagation), while another passgate may pass information to a corresponding bit comparator circuit in another bit comparator section (vertical propagation).

Figure 9:
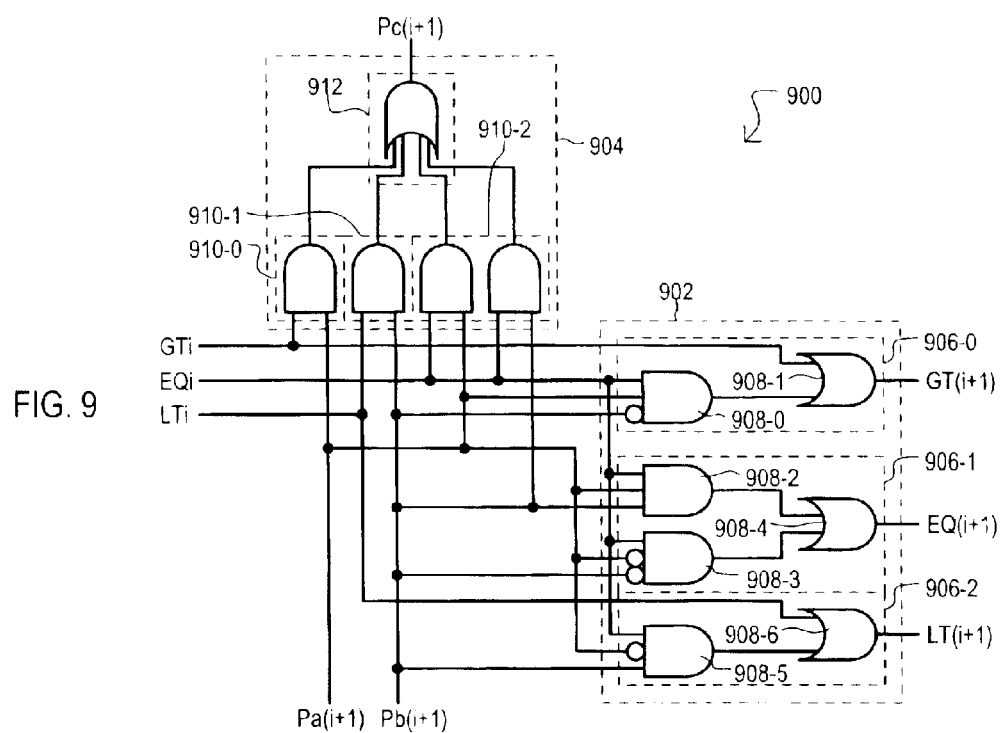
FIG. 9 is a schematic diagram of a bit compare circuit according to an embodiment of the present invention.

Referring now to FIG. 9, one very particular example of a bit comparator circuit that may be included in a comparator circuit like that shown in FIG. 8, is set forth in a schematic diagram and designated by the general reference character 900. A bit comparator circuit 900 may include a first portion 902 that may receive more significant bit compare results GTi, EQi and LTi and bits for comparison Pa(i+1) and Pb(i+1). In response to such values, a first portion 902 may output bit compare results GT(i-+1), EQ(i+1) and LT(i+1). Of course, bits for comparison could be any bits of a priority value, including status bits or soft-priority bits, as but two examples.

In FIG. 9, a first portion 902 can include a greater-than determination section 906-0, an equal-to determination section 906-1, and a less-than determination section 906-2. A greater-than determination section 906-0 may receive a more significant greater-than result GTi and equal-to result EQi, as well as the bits for comparison Pa(i+1) and Pb(i+1). If a more significant greater-than result GTi is high, a greater-than result GT(i+1) can be forced high. However, if a more significant greater-than result GTi is low and a more significant equal-to result EQi is high, a greater-than determination section 906-0 may generate a high greater-than result GTi when bit value Pa(i+1) is greater than bit value Pb(i+1).

In the very particular case of FIG. 9, a greater-than determination section 906-0 may include a three input AND-type gate 908-0 and a two input OR-type gate 908-1. Gate 908-0 may receive as inputs, a more significant equal-to result EQi, a bit value Pa(i+1), an inverted bit value Pb(i+1). Gate 908-1 may receive as inputs a more significant greater-than result GTi and an output of gate 908-0, and output greater-than result GT(i+1).

An equal-to determination section 906-1 may receive a more significant equal-to result EQi, as well as the bits for comparison Pa(i+1) and Pb(i+1). If a more significant equal-to result EQi is high, an equal-to determination section 906-1 may check to see if bits for comparison Pa(i+1) and Pb(i+1) are equal. If such bits are equal, an equal-to determination EQ(i+1) can be forced high. However, if such bits are not equal, an equal-to determination EQ(i+1) may be forced low.

In the very particular case of FIG. 9, an equal-to determination section 906-1 may include two, three input AND-type gates 908-2 and 908-3 and a two input OR-type gate 908-4. Gate 908-2 may receive as inputs a more significant equal-to result EQi, and bit values Pa(i+1) and Pb(i+1). Gate 908-3 may receive as inputs a more significant equal-to result EQi, and inverted bit values Pa(i+1) and Pb(i+1). Gate 908-4 may receive as inputs the outputs of gates 908-2 and 908-3, and may output an equal-to result EQ(i+1).

A less-than determination section 906-2 may receive a more significant less-than result LTi and equal-to result EQi, as well as bits for comparison Pa(i+1) and Pb(i+1). If a more significant less-than result LTi is high, a less-than result LT(i+1) can be forced high. However, if a more significant less-than result LTi is low and a more significant equal-to result EQi is high, a less-than determination section 906-2 may generate a high less-than result LT(i+1) when bit value Pa(i−1) is less than bit value Pb(i+1).

In the very particular case of FIG. 9, a less-than determination section 906-2 may include a three input AND-type gate 908-5 and a two input OR-type gate 908-6. Gate 908-5 may receive as inputs a more significant equal-to result EQi, an inverted bit value Pa(i+1), and a bit value Pb(i+1). Gate 908-6 may receive as inputs a more significant less-than result LTi and an output of gate 908-5, and may output less-than result LT(i+1).

In FIG. 9, a second portion 904 may receive more significant bit compare results GTi, EQi and LTi and bits for comparison Pa(i+1) and Pb(i+1). In response to such values, a first portion 902 may output a forwarded bit result Pc(i+1). A second portion 904 can include a greater-than forwarding section 910-0, a less-than forwarding section 910-1, and an equal-to forwarding section 910-2.

A greater-than forwarding section 910-0 may receive a more significant greater-than result GTi and a first bit for comparison Pa(i+1) as inputs. If a more significant greater-than result GTi is high, a greater-than forwarding section 910-0 may output a first bit for comparison Pa(i+1). The particular greater-than forwarding section 910-0 of FIG. 9 can include an AND-type gate that receives a more significant greater-than result GTi and a first bit for comparison Pa(i+1) as inputs.

In this way, if a first value has a higher priority, determined in this particular case according to magnitude, bits of such a value may be forwarded for comparison in another compare circuit.

A less-than forwarding section 910-1 may receive a more significant less-than result LTi and a second bit for comparison Pb(i−1) as inputs. If a more significant less-than result LTi is high, a less-than forwarding section 910-1 may output a second bit for comparison Pb(i+1). The particular less-than forwarding section 910-1 may include an AND-type gate that received a more significant less-than result GTi and a second bit for comparison Pb(i+1) as inputs.

In this way, if a first value has a lower priority, determined in this particular case according to magnitude, bits of a second value may be forwarded for comparison in another compare circuit.

An equal-to forwarding section 910-2 may receive a more significant equal-to result EQi, as well as bits for comparison Pa(i+1) and Pb(i+1) as inputs. If a more significant equal-to result EQi is high, an equal-to forwarding section 910-2 may output a higher of the Pa(i+1) and Pb(i+1). The particular equal-to section 910-2 of FIG. 9 can include two AND gates, one of which receives a more significant equal-to result EQi and a first bit for comparison Pa(i+1) as inputs, and another of which receives a more significant equal-to result EQi and a second bit for comparison Pb(i+1) as inputs.

In this way, if first and second values have an equal priority, determined in this particular case according to magnitude, a bit having of a higher priority (in this example, a higher magnitude) may be forwarded for comparison in another compare circuit.

A second portion 904 may further include a combining section 912. A combining section may logically combine all outputs from a greater-than forwarding section 910-0, a less-than forwarding section 910-1, and an equal-to forwarding section 910-2 to generate a forwarded bit result Pc(i+1). The particular combining section 912 of FIG. 9 can include an OR-type gate that may receive outputs from greater-than forwarding section 910-0, a less-than forwarding section 910-1, and an equal-to forwarding section 910-2 and output a forwarded bit result Pc(i+1).

Referring back to FIG. 2, it will be recalled that a comparator 216 may also provide a summary result value on a summary result line 222. The same can be true for the arrangement shown in FIG. 7. Thus, if reference is made to FIG. 8, one or more of the bit comparator circuits (854-0 to 854-3 and 856-0 to 856-7) may include or be replaced by a summary result generator.

In one very particular approach, a least significant bit compare circuit for a status value can be a summary result generator. Thus, in FIG. 8, bit comparator 854-3 can be a summary result generator. As will be recalled, a summary result generator may determine when two results are of a same type, and provide a result value indicating a multiple result indication (e.g., multiple match, miss-free entries, miss-free sub-blocks, miss-free blocks). In such an arrangement, a single result status value may have a least significant bit of "0," while the corresponding multiple result status value may have a least significant bit of "1".

Figure 10:
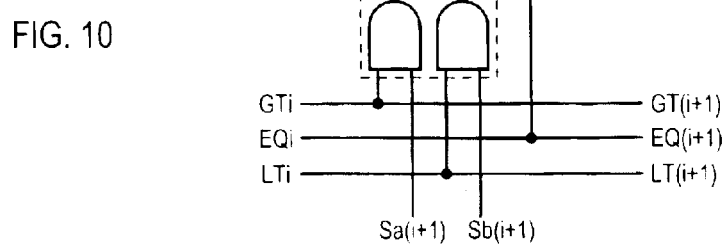
FIG. 10 is a schematic diagram of a summary result generator circuit according to an embodiment of the present invention.
Figure 11:
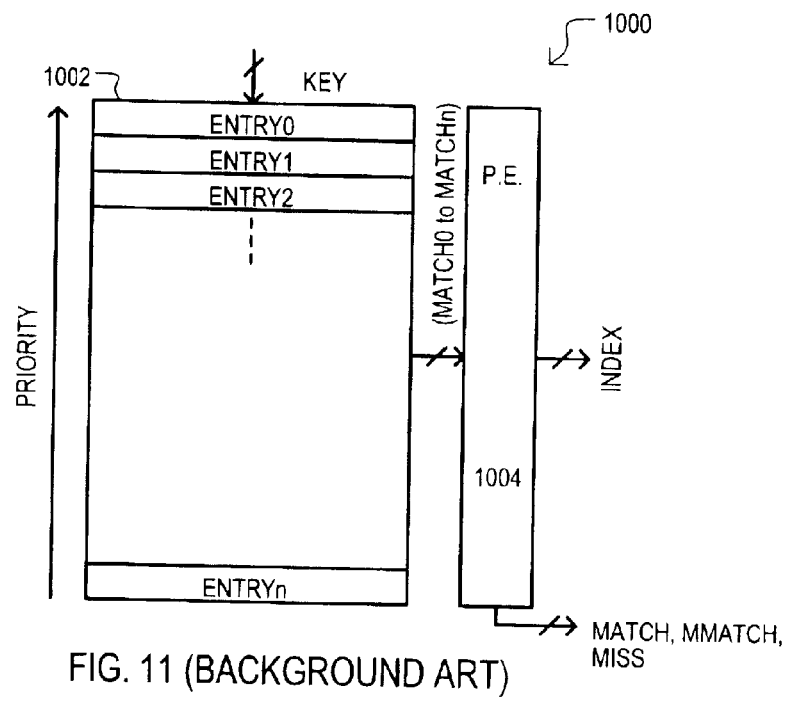
FIG. 11 is a block diagram of a conventional CAM device.
Figure 12:
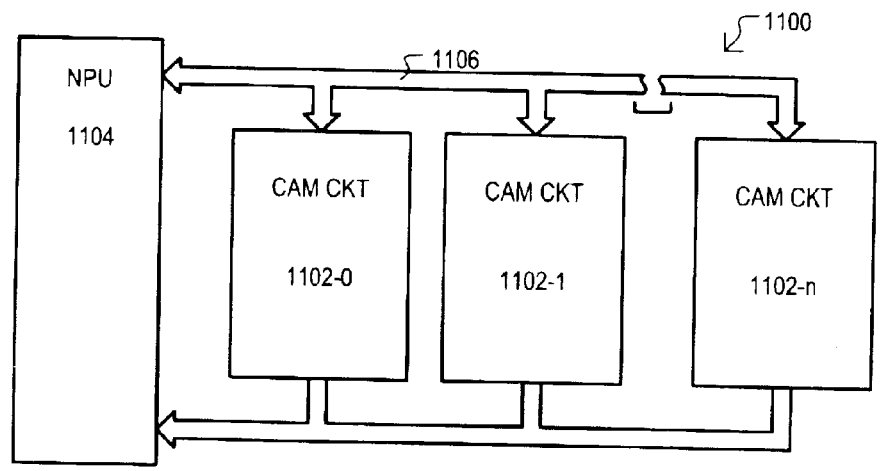
FIG. 12 is a block diagram of a conventional search engine system.

Referring now to FIG. 10, one very particular example of a summary result generator is set forth in a schematic diagram, and designated by the general reference character 1000. A summary result generator 1000 may receive more significant bit compare results GTi, EQi and LTi and summary bits for comparison Sa(i+1) and Sb(i+1). In response to such values, a summary result generator 1000 may output bit compare results GT(i+1), EQ(i+1), as well as a summary bit result Sc(i+1).

In FIG. 10, a summary result generator 1000 may include a single result forwarding section 1002 and a multiple result forwarding section 1004. A single result forwarding section 1002 may forward a first summary bit result Sa(i+1) if a more significant greater-than result GTi is high. Conversely, a single result forwarding section 1002 may forward a second summary bit result Sb(i+1) if a more significant less-than result LTi is high.

In the particular example of FIG. 10, a single result forwarding section 1002 may include two AND type gates. A first AND-type gate may receive a first summary bit result Sa(i+1) and more significant greater-than result GTi as inputs. A second AND-type gate may receive a second summary bit result Sb(i+1) and more significant less-than result LTi as inputs.

In this way, if more significant status result bits indicate that one result has a higher priority, a summary result bit for such a higher priority value can be output by a summary result generator.

A multiple result forwarding section 1004 may forward a high value if a more significant equal-to result EQi is high. In the particular example of FIG. 10, a multiple result forwarding section 1004 may include an OR-type gate that receives a more significant equal-to result EQi as an input. In FIG. 1004, such an OR-type gate may also receives, as inputs, outputs from a single result forwarding section 1002.

In this way, if more significant status result bits indicate that one result is the same as another, a summary result bit for a resulting output value may be changed from a single result value (e.g., 0) to a multiple result value (e.g., 1).

It is noted that the summary result generator 1000 of FIG. 10 may output a greater-than result GT(i+1), a less-than result LT(i+1), and an equal-to result (i+1) that can be the same as a received a more significant greater-than result GTi, a more significant less-than result LTi, and a more significant equal-to result (i+1), respectively. Such results may be forwarded to bits of lesser significance. As but one example, in the arrangement of FIG. 5, if a bit comparator 508-3 (for a least significant status bit) was replaced by a summary result generator, such a summary result generator could provide bit compare results from bit comparator 508-2 to bit comparator 510-0.

While the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A result compare circuit, comprising:
   a comparator circuit that compares input values to one another, the comparator circuit having a first input coupled to receive a first result status value from a first portion of a content addressable memory (CAM and a second input coupled to receive a second result status value from a second portion of the CAM.

2. The result compare circuit of claim 1, wherein:
   the comparator circuit includes a plurality of bit comparators having a significance with respect to one another, each comparator circuit generating a bit comparison result.

3. The result compare circuit of claim 2, further including:
   a subsequent result compare circuits in a result compare flow;
   a prior result compare circuit in the result compare flow; and
   the comparator circuit provides the bit comparison results to the subsequent result compare circuits in the result compare flow and receives bit comparison results from the prior result compare circuit in the result compare flow.

4. The result compare circuit of claim 2, wherein:
   the bit comparison results include a greater-than result, a less-than result and equal-to result.

5. The result compare circuit of claim 2, wherein:
   each bit comparator includes
   a first portion that receives a bit from a first result status value, a bit from a second result status value, and a compare result from a higher significance bit comparator, and generates an output bit comparison result for a bit comparator of less significance.

6. The result compare circuit of claim 5, wherein:
   each bit comparator includes
   a second portion that receives a bit from a first result status value, a bit from a second result status value, and a compare result from a higher significance bit comparator, and outputs the bit from the first result status value if a compare result is greater-than, outputs the bit from the second result status value if a compare result is less-than, and outputs a highest of the bits from the first or second result status values if a compare result is equal to.

7. The result compare circuit of claim 1, wherein:
   the comparator circuit further includes a summary result generator that outputs one value if a selected portion of a first status result value matches a corresponding portion of a second status result value.

8. The result compare circuit of 1, further including:
   a second result comparator circuit; and
   a multiplexer (MUX) having a first MUX input that receives result data from the first portion of the CAM, a second MUX input that receives result data from the second portion of the CAM, a control input coupled to the comparator circuit, and an output coupled to an input of the second result comparator circuit.

9. A method of generating search results in a content addressable memory (CAM) device, comprising the steps of:
   generating search results in a plurality of CAM sections that each include a plurality of CAM entries, each search result including a priority value; and
   comparing multiple priority values to generate a highest priority search result from the plurality of search results.

10. The method of claim 9, wherein:
    the step of comparing multiple priority values includes comparing a first priority value from a first search result with a second priority value from a second search result to generate a compare result; and
    selectively outputting at least a portion of either the first search result or the second search result according to the compare result.

11. The method of claim 10, further including:
    forwarding at least a portion of the compare result between the first priority value and the second priority value for comparison with a third priority value from a third search result before selectively outputting either the first search result or the second search result.

12. The method of claim 10, wherein:

comparing the first priority value to the second priority value includes comparing bits of the first priority value to corresponding bits of the second priority value in a sequential fashion, from a more significant bit to a less significant bit.

13. The method of claim 12, wherein:

comparing a bit of the first priority value to a corresponding bit of the second priority value includes generating a bit compare result if a more significant bit compare result is an equal-to result, generating a greater-than result if a more significant bit compare result is a greater-than result, and generating a less-than result if a more significant bit compare result is a less-than result.

14. The method of claim 12, wherein:

comparing a bit of the first priority value to a corresponding bit of the second priority value includes outputting the bit of the first priority value if a more significant bit compare result is a greater-than result, outputting the higher of the bit of the first priority value and bit of the second priority value if the more significant bit compare result is an equal-to result, and outputting the bit of the second priority value if a more significant bit compare result is a less-than result.

15. A content addressable memory (CAM) device, comprising:

a plurality of sub-blocks that each compare a key value to stored data values; and at least one sub-block magnitude comparator for selectively providing an output of one of the plurality of sub-blocks according to a priority value associated with the one sub-block.

16. The CAM device of claim 15, further including:

the plurality of sub-blocks are arranged into blocks; and a block magnitude comparator for selectively providing an output of one of the blocks according to a priority value associated with at least one of the sub-blocks in the one block.

17. The CAM device of claim 15, further including:

a multiplexer having a first input coupled to one of the plurality of sub-blocks, a second input coupled to another one of the plurality of sub-blocks, and a control input coupled to the at least one sub-block magnitude comparator.

18. A content addressable memory system, comprising:

at least one CAM that determines a search result precedence using a predetermined set of weighted search result factors, the at least one CAM including entries divided into blocks; and the search result factors include a priority value for a block containing a free entry.

19. The content addressable memory system of claim 18, wherein:

the search result factors include a priority value for a block containing a matching entry.

20. The content addressable memory system of claim 18, wherein:

the search result factors include a priority value for a free block.

21. The content addressable memory system of claim 18, wherein:

the blocks are divided into sub-blocks.

22. The content addressable memory system of claim 21, wherein:

the search result factors include a priority value for a sub-block containing a matching entry.

23. The content addressable memory system of claim 21, wherein the search result factors include a priority value for a sub-block containing a free entry.

* * * * *